United States Patent
Palumbo et al.

(10) Patent No.: US 7,827,513 B2
(45) Date of Patent: Nov. 2, 2010

(54) BUFFER PLACEMENT WITH RESPECT TO DATA FLOW DIRECTION AND PLACEMENT AREA GEOMETRY IN HIERARCHICAL VLS DESIGNS

(75) Inventors: Joseph J. Palumbo, Poughkeepsie, NY (US); Christopher J. Berry, Hudson, NY (US); Adam R. Jalkowski, Wyoming, PA (US)

(73) Assignee: International Business Machines Corporation, Armonk, NY (US)

( * ) Notice: Subject to any disclaimer, the term of this patent is extended or adjusted under 35 U.S.C. 154(b) by 406 days.

(21) Appl. No.: 11/870,728

(22) Filed: Oct. 11, 2007

(65) Prior Publication Data
US 2009/0100397 A1  Apr. 16, 2009

(51) Int. Cl.
*G06F 17/50* (2006.01)
(52) U.S. Cl. .......................... 716/10; 716/14
(58) Field of Classification Search ............... 716/8–14
See application file for complete search history.

(56) References Cited
U.S. PATENT DOCUMENTS

| | | | |
|---|---|---|---|
| 6,622,291 B1 * | 9/2003 | Ginetti ..................... 716/9 |
| 6,662,349 B2 | 12/2003 | Morgan | |
| 6,826,740 B2 | 11/2004 | Drumm | |
| 7,036,103 B2 | 4/2006 | Miller | |
| 7,065,730 B2 | 6/2006 | Alpert | |
| 2002/0184607 A1 | 12/2002 | Alpert | |
| 2003/0163795 A1 * | 8/2003 | Morgan et al. ............. 716/10 |

* cited by examiner

*Primary Examiner*—Stacy A Whitmore
(74) *Attorney, Agent, or Firm*—William A. Kinnaman, Jr.; Lynn L Augspurger

(57) ABSTRACT

A method for identifying and modifying, in a VLSI hierarchical chip design, parent buffer placements which lead to wiring track inefficiencies with respect to data flow and the parent placement area geometry. Parent placement area is reviewed and a subset is categorized and distinguished as either horizontal slots or vertical slots. Buffer to buffer data flow is reviewed for cases where data flow direction is either strongly horizontal or strongly vertical. Situations where buffer to buffer data flow is oriented in the same direction as the parent placement slots in which the buffers reside are reported. Additionally, an attempt is made to find a valid placement location for the buffers excluding parent placement areas oriented in the same direction as the data flow.

17 Claims, 8 Drawing Sheets

CONFLICTS W/ HORIZONTAL TRACKS USED TO ACCESS BUFFERS WITH VERTICAL DATAFLOW LEAD TO HORIZONTAL AND VERTICAL TRACKS BEING USED TO REACH DESTINATION BUFFERS

NOW PLACED IN VERTICAL SLOTS, THE BUFFERS WITH HORIZONTAL DATAFLOW CAN REACH THEIR DESTINATION BUFFER WITH ONE HORIZONTAL TRACK UTILIZED PER NET

BUFFER PLACEMENT WITH RESPECT TO DATA FLOW DIRECTION AND PLACEMENT AREA GEOMETRY IN HIERARCHICAL VLS DESIGNS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to the physical design process of designing hierarchical VLSI semiconductor chips. This invention is particularly directed at the placement of buffers with respect to localized placement and wiring contracts in order to enhance wiring track utilization.

2. Description of Background

A VLSI chip, which is a physical device, of course, may also be considered a logical entity in a hierarchical arrangement, particularly prior to actual manufacture of the chip. In one instance, for example, the chip may be defined as a logical parent entity having physical "unit" entities within its physical boundaries, where the units are logically defined as logical children entities of the parent chip. In turn, the units have macros within their physical boundaries, with the macros being defined as children of respective units.

From the foregoing, it should be appreciated these entities may be considered both entities in a logical sense and in a physical sense. That is, in a pre-fabrication stage, the entities have pre-defined, logical relationships among one another and are logical representations of what will become physical entities in a tangible IC chip. Even in the pre-fabrication stage, however, the representations are, themselves, physical in some respects, since they include data structures stored on a physical, computer-readable storage medium. So the entities discussed herein may be referred to as either physical or logical entities, although they are generally referred to herein as logical entities.

These logical entities have structural and functional properties that may be logically defined at a higher level of abstraction than mere physical circuitry, but that ultimately relate to circuitry, i.e., are decomposable into physical circuitry. For example, the logical entities may be defined in a very high level design language as Boolean logic blocks or equations. Nevertheless, ultimately they can be expressed in terms of very basic physical circuitry. These properties include data structures or instructions stored in a computer readable memory.

In this context, "wiring contracts" include rules governing the process of laying out wiring for VLSI chips, where chip space is "contracted" for wiring among a chip's hierarchically-related, logical entities. (Aspects of this process may also be referred to as "placing," "routing," and "allocating" wiring.) In other words, wiring contracts define certain wiring locations on the chip for interconnecting the distinct logical entities on the chip and define use of wiring tracks within those wiring locations, including allocation of the wiring tracks to the logical entities on a hierarchical level by level basis.

The term "wiring contracting," as used herein, refers to a process or processes of allocating silicon space of the VLSI chip in the context of the chip design process or processes, particularly with respect to allocating wiring tracks of the chip.

As dimensions in semiconductor technologies shrink and frequency of operation increases, it becomes increasingly necessary to buffer parent nets in VLSI hierarchical designs, particularly in semiconductor chips. Whereas in older technologies it may have been possible to completely route wiring over a child entity without requiring a buffer, hi current technologies buffers are more often required. Consequently, silicon area must now be even more closely negotiated between parent entity and child entity. Additionally, lower levels of metal wiring must be more closely negotiated, so that the parent can access buffers.

Methods such as those described in U.S. Pat. No. 6,341,365, "Method for automating die placement of a repeater device in an optimal location, considering pre-defined blockage, in a high frequency very large scale integration/ultra large scale integration (VLSI/ULSI) electronic designs," are aimed at finding optimal placement locations in unoccupied silicon area, but don't consider detailed aspects of wiring contracts that are advantageously taken into account in the present invention, data flow Methods such as US20020184607A1, "Practical methodology for early buffer and wire resource allocation" and U.S. Pat. No. 6,826,740 B2, "Automated buffer insertion incorporating congestion relief for use in connection with physical design of integrated circuit" use congestion relief algorithms to re-route Sterner trees and more evenly disperse buffers. Although these concepts should help to generate more uniform buffer densities across a large region, they don't consider detailed aspects of wiring contracts that are advantageously taken into account in the present invention.

It should also be noted that choosing one Steiner tree over another does not necessarily guarantee that the congestion problem will improve as there are an extremely large number of possible Steiner trees for any given net.

SUMMARY OF THE INVENTION

The shortcomings of the prior art are addressed and additional advantages are provided through identifying buffers placed in slots oriented in the same direction as buffer date flow and checking for valid placement locations excluding slots that are oriented in the direction of buffer data flow. By replacing buffers such that their data flow does not run parallel to the placement slot in which they reside, wiring tracks are more efficiently used and overall routing enhanced.

Parent placement areas whose shapes take the form of thin slots are categorized and distinctions are made between those that run vertically and those that run horizontally. Root nets of all buffered nets are examined and traced forward to check for buffer to buffer connections whose path flow is either decisively horizontal or vertical. In such cases, the placement location is checked for both buffers of such a butler to buffer connection to see if the buffers reside in a parent placement slot whose orientation and associated wiring contract are inconsistent with the data flow of the buffers.

Specifically, buffers with horizontal data flow are checked for placement in horizontal slots and buffers with vertical data flow are checked for placement in vertical slots. When these conditions are met, the sink buffer instance is reported along with the non-desired parent slot orientation. Additionally, an attempt is made to find a valid placement location for the sink buffer in which parent slots of the non-desired orientation are not considered legal placement area. If such a location is found, the new coordinates are reported and the sink buffer placement is changed, i.e., the sink buffer is relocated. The designer can then use this information to review and, if necessary, replace the buffer paths in a manner more consistent with the buffer data flow and parent placement area wiring blockage, subsequently improving wiring track efficiency.

In other words, in the design of an integrated circuit device that includes child logical entities having physical areas located within a physical area of a parent logical entity and includes parent placement areas for placement of buffers associated with the parent for wiring among ones of the child entities, wiring buffers are placed in initial locations in ones of the placement areas. A first wiring buffer is detected that is associated with the parent entity and has an initial location in a first one of the parent placement areas within the child physical area. Geometric orientations of the parent placement areas and a data flow orientation for the first wiring buffer are detected. The location of the first wiring buffer is changed responsive to detecting correspondence between the geometric orientation of the first one of the parent placement areas and the date flow orientation of the first wiring buffer.

In a further aspect, detecting geometric orientations includes computing aspect ratios of placement areas responsive to respective lengths and widths of the placement areas and comparing the computed aspect ratios to predetermined thresholds.

In a further aspect, detecting the first wiring buffer includes identifying that the buffer is a sink and is connected in a net to a source wiring buffer, wherein the net has no other sink wiring buffer.

In a further aspect, detecting data flow orientation includes comparing vertical wire length and horizontal wire length of the net between the source and sink wiring buffers.

In a further aspect, changing the location of the first wiring buffer includes selecting a second parent placement area for the changed location from among ones of the parent placement areas having geometric orientations not corresponding to the data flow orientation of the first wiring buffer.

In a further aspect, detecting geometric orientations includes detecting lack of geometric orientations of ones of the placement areas. Also, changing the location of the first wiring buffer includes selecting a second placement area for the changed location from among ones of the placement areas having no detected geometric orientation or having geometric orientations not corresponding to the data flow orientation of the first wiring buffer.

In a further aspect, the placement areas are selected.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically a solution is achieved which considers localized wiring contracts in the placement area under consideration and the geometry of the parent placement area. That is, the present invention involves a recognition that the failure of current buffer placement algorithms to do this results in buffers with horizontal data flow being placed in a horizontal parent placement slot, which, in turn, leads to inefficiencies in wiring track utilization. That is, in a horizontal parent placement slot, parent usage of vertical wiring tracks is reduced at the expense of horizontal tracks utilization in order to minimize the wiring impact on child entities due to parent buffer pin access. The present invention involves a recognition that wiring tracks required by the buffers with horizontal data flow are then in conflict with the tracks used to access buffer pins by buffers with vertical data flow. By identifying situations where buffers are placed in parent placement slots oriented in the same direction as the buffer data flow and replacing outside of such slots, wiring track utilization can be maximized.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
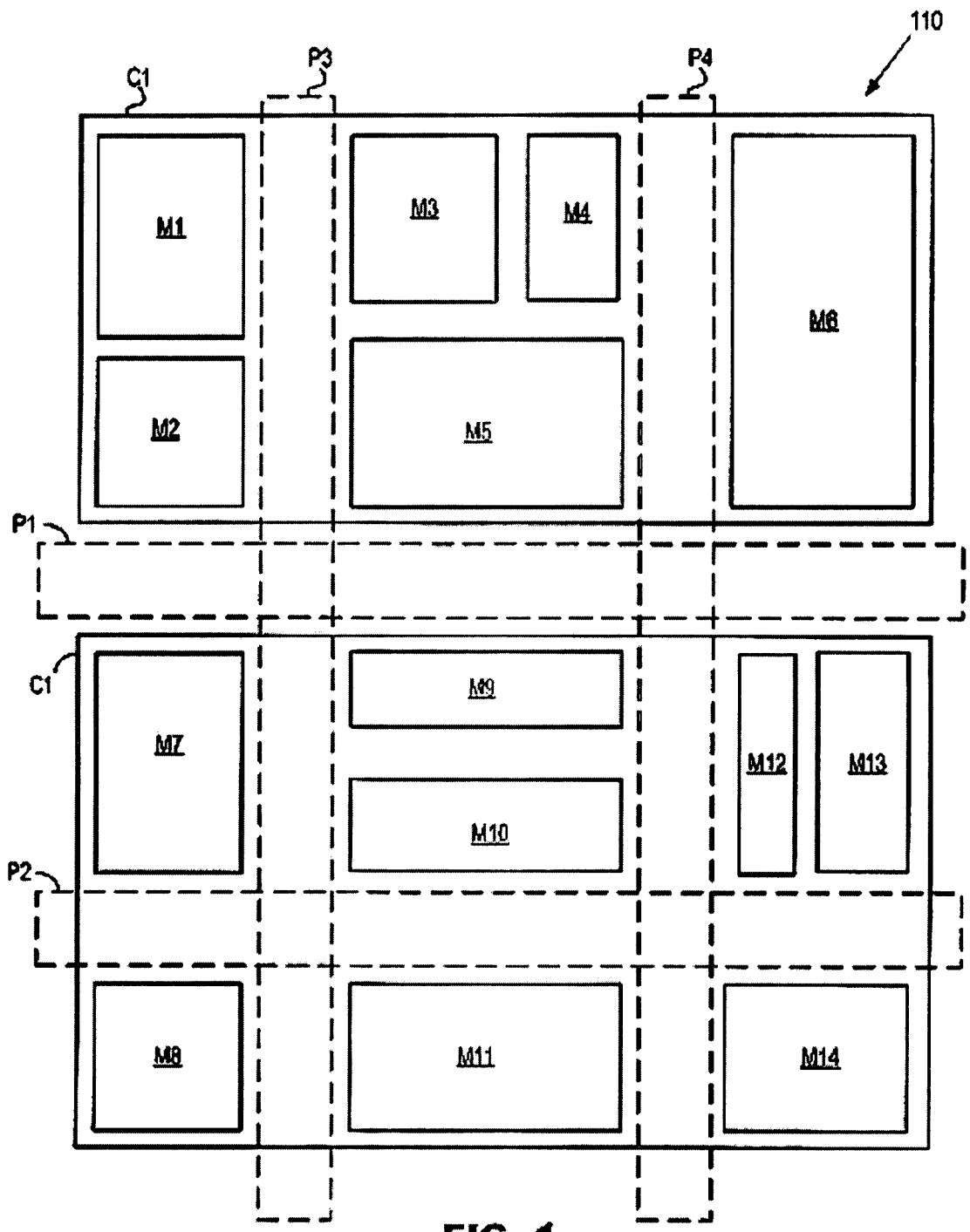
FIG. 1 illustrates how the parent placement areas in a hierarchical VLSI design tend to take on the form of horizontal and vertical slots to avoid collision with grandchild entities and further complicate placement and wiring contracts, according to an embodiment of the present invention.

The following detailed description explains preferred embodiments of the invention, together with advantages and features, by way of example with reference to the drawings.

DETAILED DESCRIPTION OF THE INVENTION

In the following detailed description of the preferred embodiments, reference is made to the accompanying drawings illustrating embodiments in which the invention may be practiced. It should be understood that other embodiments may be utilized and changes may be made without departing from the scope of the present invention. The drawings and detailed description are not intended to limit the invention to the particular form disclosed. On the contrary, the intention is to cover all modifications, equivalents and alternatives falling within the spirit and scope of the present invention as defined by the appended claims. Headings herein are not intended to limit the subject matter in any way.

The chip design process or processes described herein may be implemented by logic in the form of instructions executing on a computer system (also referred to as a "data processing system"), or entirely in the form of hardware, or in an embodiment containing both hardware and software elements. Application specific integrated circuitry is another example of hardware. Aspects of wiring contracts may be defined as properties of the chip's logical entities. The term "logic" is used herein to refer to chip "design logic" which refers to logic that implements processes for designing a VLSI chip, processes relating to wiring. This design logic should not be confused with the above described "logical entities" of the chip itself; i.e., the logical entities that are representations of physical circuitry of the chip and that have properties defining their respective portions of the physical circuitry.

Note that the hierarchical classifications of the logical entities are not necessarily related in terms of when the entities arose during the design process for a chip. Rather, it should be merely be understood that in the above example the end result of a chip design process is a structure in which a parent chip contains, or at least has associated with, children units that are in a sense placed thereon. Likewise, the children units contain, or at least are associated with, respective grandchildren macros that are in a sense placed on respective units.

Note also that the hierarchical classifications are not necessarily fixed throughout the entire chip. That is, in a first portion of a chip, a unit may be a child of the chip, while in a second portion, a core may be a child of the chip and a unit may be a child of the core, for example. Thus, in die second portion of the chip, an entity classified as a unit is a grandchild of the chip, but in the first portion, an entity classified as a unit is a child of the chip.

It should be also understood that just as the hierarchical classifications are not necessarily fixed throughout the entire chip, likewise, the way in which logical entities are defined is not necessarily fixed throughout an entire logical entity. That is, a first part of a logic entity may be defined in a first manner, which uses a first set of terms, and a second part of the same entity may be defined in a different manner, which uses a second set of terms, where the first and second sets of terms define their portions of the chip at different levels of abstraction.

Referring now to FIG. 1, a chip 110 is shown, according to an embodiment of the present invention. Chip 110 is both a logical entity and a physical entity. That is, as a physical entity, chip 110 includes the entire IC die, according to the illustrated embodiment, hi addition, as a logical entity, chip 110 includes a logically defined, physical boundary diet corresponds to the entire extent of the physical chip 110. In the classification arrangement of the illustrated embodiment, a definition of chip 110, as a logical entity, includes defined boundaries of physical chip 110 within which child entities unit C1 and C2 are located, or at least points to those boundaries, which may be defined as properties of some other logical entity. (FIG. 1 does not illustrate all of chip 110 and, accordingly, does not illustrate all units and macros in chip 110.) Chip 110, as a logical entity, also includes (or at least points to) defined boundaries of physical chip 110 referred to as "wiring tracks" within which wires are located for connections among units C1 and C2. Chip 110, as a logical entity, also defines (or at least points to) each specific one of those wires, including size and placement thereof. The chip entity and die child entity in combination determine which wiring tracks are allowed to be used by the chip entity in connecting chip level nets (i.e., C1 to C2). The child entity contains information which can "block" certain tracks on certain levels to the parent. Post routing, the chip entity then defines the specifics of the chip level nets (C1 to C2 connections).

Illustrated units C1 and C2 are logically classified as children of chip 110. Macros M1 through M14 are classified as grandchild of the chip 110. In the classification arrangement of the illustrated embodiment, a definition of logical entity unit C1 includes defined a definition of its own boundaries within physical chip 110. Macros M1 through M6 are located within the boundary of unit C1 and the definition of entity unit C1 includes macro location definitions. Additionally, the definition of unit C1 includes defined constraints that block certain wiring tracks/levels to the parent, i.e., prevents parents from using certain wiring tracks or levels, and "posts routing" i.e., detailed placement information and other properties of wiring among the macros. Correspondingly, a definition of unit C2 defines placement of macros M7 through M14 and routing of wiring among those macros in a wiring track logically associated with unit C2, etc. In turn, the definition of chip 110 defines placement of units C1 and C2 and routing of wiring between those units in a wiring track logically associated with chip 110.

From the above description and the illustration of FIG. 1, it can be appreciated that entities ore logically defined in a hierarchy of logical levels. In this sense, logical entities may be considered as logically "placed" one "above" another at least in a logical sense. For example, in chip 110, entities unit C1 and C2 are logically placed, in a sense, on or within the logical definition of chip 110. Likewise, macros M1-M6 are logically placed on unit C1, and macros M7-M14 are logically placed on unit C2.

Note also that in FIG. 1, unit C1 and C2 are physically located (i.e., also "placed" in a more physical sense) within the physical boundaries of physical chip 110. In turn, macros M1-M6 are physically located within the physical boundaries of physical chip 110 that are defined as the physical chip 110 boundaries for unit C1. Likewise, macros M7-M14 are physically located within the physical boundaries of physical chip 110 that are defined as the physical chip 110 boundaries for unit C2. In an embodiment of the invention, this correspondence between physical and logical "placement" always occurs and, correspondingly, it is not permitted where, say for example, macro M6 extends so that part of it is physically located partly within the physical boundaries of chip 110 reserved for both C1, while another part is located within the physical boundaries for C2. And it is not permitted where, say for example, the macro M6 logically belongs partly to logical entity C1 and partly to logical entity C2. On the other hand, slots P3 and P4, which will be discussed herein below, may represent areas where chip level circuits may be placed within the C1 physical boundary in areas which have been designated for the chip, in genera), however, only one "entity" can own a specific placeable coordinate. It is also generally the case that any entity will not logically belong (be split) amongst multiple entities.

This arrangement of logical levels should not be confused, with physical layers of chip 110. As is well known in the art, transistors (not shown) in chip 110 are built in a structure that has several physical layers. Setting aside those component layers for the transistors of chip 110, the transistors themselves may be considered as constituting a single physical layer. In this sense, while chip 110 has multiple levels of logical entities that ultimately define circuitry, where circuitry includes transistors and wires there between, chip 110 has only one physical layer of transistors (not shown). Thus, while one logical entity resides "above" another on chip 110 in a logical sense, the transistors that the entities ultimately define are all in a single physical layer.

On the other hand, white the transistors of chip 110 are in a single physical layer, chip 110 has wiring (not shown) in multiple physical layers, i.e., wires running in one plane above and below other wires in other planes, with nonconductive physical layers of material, such as silicon, between wiring planes. In at least some instances, a physical layer of wires, or a set of such wiring layers, corresponds to a logical level in the hierarchy of logical entities.

In the layout of an IC chip such as chip 110, situations arise in which wires, also referred to as "nets," between logical entities sometimes are so long that they must be buffered, (In this context, "buffering" refers to adding repeaters in the wires to repower signals in order to compensate for transmission losses.) This increasingly happens because of the long-standing trend toward shrinking dimensions of circuitry and increasing operational clock frequency of the circuitry. One particular situation in which this need for buffering commonly arises is where wiring associated with a parent entity competes with space on the chip with wiring associated with a child, since this tends to result in at least some relatively long wires.

It is conventional to tend to place wiring between lower level logical entities in one set of wiring layers and wiring between higher level logical entities in another set of wiring layers. For example, wiring between macros M7 and M8 may be preferentially placed in lower wiring layers, while wiring between children units C1 and C2 may be preferentially placed in higher wiring layers. Nevertheless, it is a complex process to place a multitude of transistors and wires on chip 110 without creating shorts, but with workable transmission lengths, hi order to reduce the complexity of this task, it is a aspect of an embodiment of the present invention that within the physical space allocated for a child of chip 110, some vertical and horizontal oriented polygon shaped silicon areas, which are referred to herein as "placement areas" or "slots," are allocated, i.e., "contracted," for preferentially placing wiring associated with the parent chip 110, i.e., wiring between children logical entities of parent chip 110, in wiring layers or wiring tracks that would conventionally be preferentially used for wiring between macros, where the placement of the wiring is governed by parent chip 110. To simplify silicon and wiring contracts and minimize the impact on children, the parent silicon area typically includes horizontal and vertical slots.

These placement areas are shown in FIG. 1 as horizontal placement areas P1 and P2 and vertical placement areas P3 and P4. (In this context, "vertical" or "horizontal" orientation refers to vertical or horizontal as viewed from above the chip.) That is, while the definition of a child entity, such as unit C1 or unit C2, includes defined physical boundaries on the physical chip 110, nevertheless, within those defined boundaries for physical placement of the child, i.e., within the child, design logic 700 locates, i.e., "contracts," vertical and horizontal oriented polygon shaped placement areas P2-P4 within lower wiring layers for wiring between children logical entities C1 and C2. Design logic 700 not only locates the placement areas, but also locates the wiring itself within these areas according to predetermined rates, as will be further described herein. That is, design logic 700 selects wiring tracks within these placement areas P2-P3 in such a way as to give priority to wiring between children logical entities C1 and C2. (Placement area P1 is also for wiring between children logical entities C1 and C2, and is also subject to such wiring contracting, but area P1 is not physically located within either child C1 or C2 in the illustrated instance.)

Placement areas P1-P4 may also be "associated" with the parent chip 110 logical entity's definition. More specifically, placement areas P2, P3 and P4 are "associated" with chip 110 in placement terms through a lack of chip 110 "placement blockage" defined by units C1 or C2 in placement areas P2, P3 and P4, thus allowing chip 110 to place in placement areas P2, P3 and P4 at it's level of hierarchy, despite their locations within the child areas C1 and C2. Likewise, the definitions of entities C1 and C2 do have unit C1 and C2 placement blockage in placement areas P2, P3 and P4, thus preventing units C1 and C2 themselves from placing in placement areas P2, P3 and P4, i.e., at their own level of hierarchy. Area P1 is not necessarily subject to wire contracting as it does not fall within the physical boundary of either child C1 or C2.

Note that the above described contracting, placement and association issues do not necessarily apply throughout an entire placement area P1-P4 in an embodiment of the invention. That is, different entities may share wiring levels and tracks in particular regions. For example, over macro M5 certain wiring tracks on particular wiring levels may be allocated to macro M5, others may be allocated to unit C1 and still others may be allocated to chip 110. Likewise, areas P2, P3 and P4 may contain wiring tracks associated with both chip and unit.

These placement areas P1-P4 may herein also be referred to as "slots," because in the illustrated embodiment of the invention, the areas are rectangles that are relatively much longer than wide. An aspect ratio of less than $1/10$ or greater than 10 is a good rule of thumb, in one embodiment of the invention, Slots P1-P4 include grids of horizontal and vertical wiring tracks (not shown in FIG. 1) where buffers (not shown in FIG. 1) associated with parent chip 110 are located. The vertical grids in P3 and P4 are given to the parent during contracting and the horizontal grids in P1 and P2 are given to the parent (P1 may not involve a contract with child as it is not over the C1 or C2 boundary). Slots P1-P4 are thin in order to give design logic 700 sufficient area to place macros M1-M6 and M7-M14 within their respective units C1 and C2.

As previously mentioned, parent associated areas P2-P4 are located within the boundaries of children C1 and C2, as described herein above and illustrated in FIG. 1. It is further notable that parent areas P2-P4 are not only located within the boundaries of respective children C1 and C2, but in the illustrated embodiment of the invention a parent area even runs completely through a child, thereby isolating one portion of the child from another portion of mat child. For example, parent area P3 isolates the portion of child C1 that bounds macros M1 and M2 from the portion of child C1 that bounds macros M3-M6. Likewise, parent area P4 isolates the portion of child C1 that bounds macro M6 from the portion of child C1 that bounds macros M1-M5. Thus, the locations of parents P2 and P3 divide child C1 into three isolated portions, wherein the first portion contains macros M1 and M2, the second portion contains macros M3-M5, and the third portion contains macro M6.

Note also that according to the wiring contracts of the current embodiment of the present invention, which are defined by design logic 700 and instantiated as properties of logical entities, the placement areas P2-P4 of parent chip 110 are not permitted to run through grandchild macros M1 through M14. Indeed, none of parent areas P1-P4 are located even merely partly within any portion of any of grandchildren M1 through M14. Consequently, while the locations of parent placement areas P1-P4 give rise to child contracting issues, they do not give rise to grandchild contracting issues.

To further illustrate wiring contracting issues arising from the locations of parent placement areas P1-P4 relative to children C1 and C2, consider the situation depicted in FIG. 1 regarding lower horizontal slot P2 as concerns macros M7 and M8 within child unit C2. It is an objective of design logic 700 to minimize the number of vertical wiring tracks the parent chip 110 takes from child unit C2 in slot P2, because (here will almost certainly be a need for wiring between macros M7 and M8. (Design logic 700 defines the wiring between macros M7 and M8 as part of the definition of unit C2, which is their parent.) The allocation by design logic 700 of the physical placement area defined as horizontal slot P2 allocated to parent chip 110 includes prohibition of any circuitry for macros such as M3 or M4 within slot P2. The contracting by design logic 700 of the physical placement area defined as horizontal slot P2 also includes prohibiting within at least some portions therein, such as on certain wiring layers or wiring tracks, any wiring that is solely internal to unit C2, i.e., intra-unit C2, and oriented horizontally. An example of intra-unit C2 wiring is wiring solely between macros M7 and M8. That is, design logic 700 structures a wiring rule and enforces a wiring process that prohibits such wiring, so that parent chip 110 gets all horizontal tracks within at least some portions of horizontal wiring slot P2, which is associated with the parent chip 110. (By "gets all horizontal tracks," this means all those horizontal tracks are used exclusively for wiring between children.)

In one embodiment of the invention, design logic 700 structures a wiring rule and enforces a wiring process that prohibits horizontally oriented intra-unit C2 wiring only in certain lower layers of wiring, so that the exclusive use by parent chip 110 of horizontal wiring tracks in horizontal wiring slot P2 is limited only to certain lower layers of wiring.

The parent chip 110 tends to use lower horizontal tracks to access pins of buffers (not shown in FIG. 1) placed in P2. Note that the horizontal tracks in P2 would not prove useful in trying to connect C1 to C2, since they are placed vertically with respect to each other on the chip. Therefore, data flow from C1 to C2 does not tend to be horizontal, as will be discussed further herein below. But for horizontal-oriented wiring between C2 and other children (not shown in FIG. 1), all the horizontal tracks in at least a portion of F2 are allocated to the chip 110 to help minimize the vertical tracks the chip requires to the buffer pins.

Figure 2:
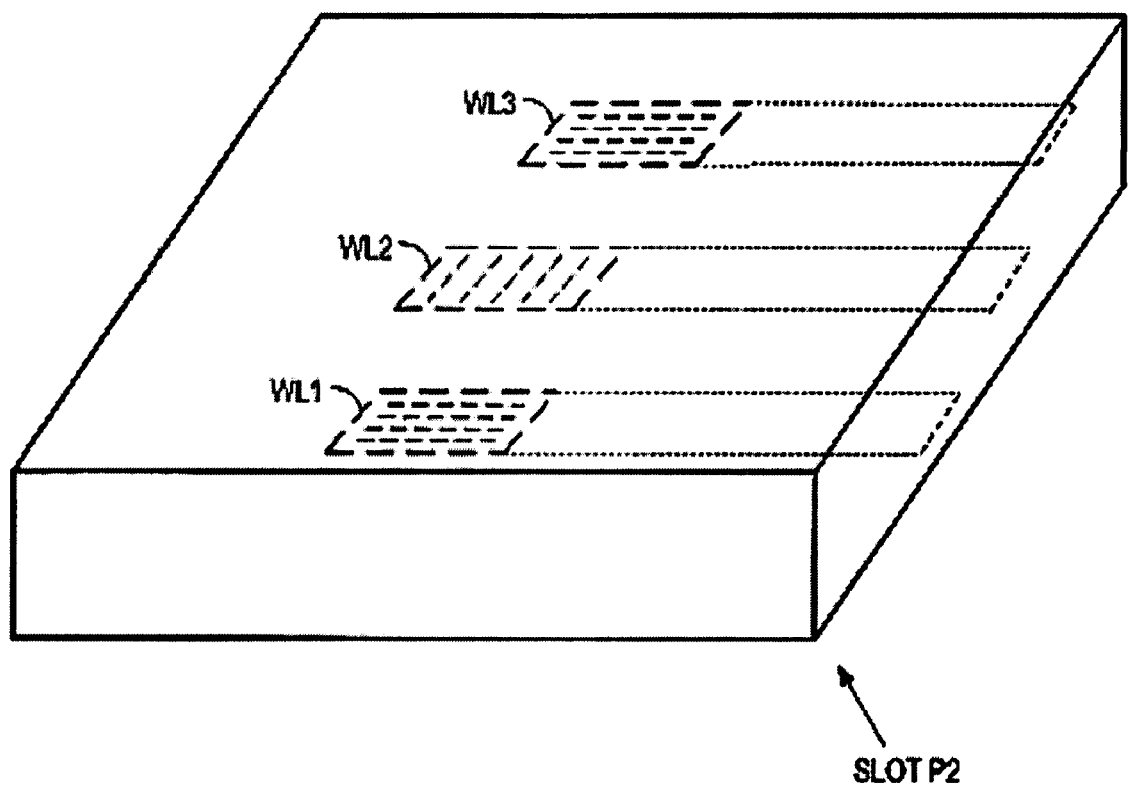
FIG. 2 further illustrates a portion of one of the slots shown in FIG. 1.

Referring now to FIG. 2, aspects are illustrated of a portion of slot P2 of FIG. 1, namely a portion that is between macros M7 and M8, according to the illustrated embodiment. Within this portion of slot P2 there are three physical layers of wiring WL1, WL2 and WL3, where wiring layers WL1 and WL3 are oriented "horizontally" (i.e., as viewed from above chip 110 of FIG. 1) and layer WL2 is oriented "vertically" (i.e., as viewed from above chip 110 of FIG. 1). The so-called vertical wiring layer WL2 is in a plane in between planes of the two so-called horizontal layers WL1 and WL3, with WL1 being below WL2, and with WL3 being above WL2. (It should be understood that within this portion of slot P2 there are additional wiring layers above the three physical layers of wiring WL1, WL2 and WL3 that are illustrated and discussed in this instance.)

Referring again to FIG. 1, in the wiring allocation, i.e., "contract," that design logic 700 imposes for child C2 relating to parent slot P2, which are located within the physical boundaries of child C2, design logic 700 allocates to parent chip 110 a large number of horizontal wiring tracks in slot P2 for accessing buffers in horizontal-oriented wiring between child C2 and other children (not shown in FIG. 1), but only a small number of vertical tracks. Conversely, since child unit C2 inevitably needs to interconnect macros M7 and M8, child unit C2 needs many more vertical than horizontal wiring tracks in this physical area of slot F2 between macros M7 and M8. Accordingly, design logic 700 allocates to child unit C2, more of the vertical tracks in slot P2.

Figure 3:
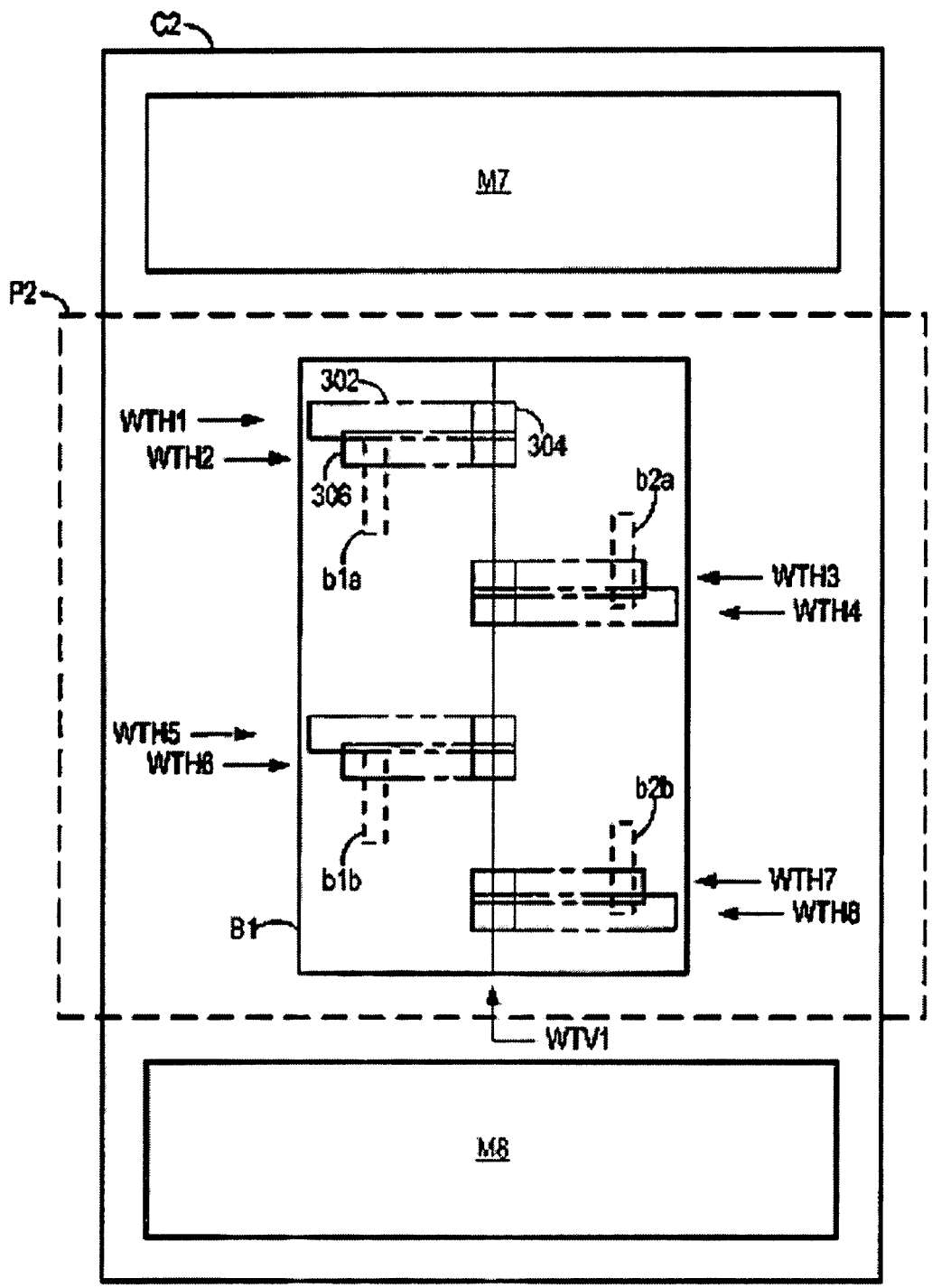
FIG. 3 shows how multiple wiring tracks in the direction of placement slot orientation are used by the parent to access buffer pins in order to maximize the wiring trades given to the child which run perpendicular to the placement slot, according to an embodiment of the present invention.

For further details of this issue, refer now to FIG. 3, which illustrates additional aspects of wiring and buffering within a portion of slot P2 between macros M7 and M8, according to an embodiment of the present invention. There are two buffers B1 and B2 illustrated in this portion of slot P2 that need to be accessed for wiring between child C2 and other children (not shown in FIG. 1). Buffer B1 has two pins b1*a* and b1*b*, one of which is an input pin and one of which is an output pin. Likewise, buffer B2 also has two such pins b2*a* and b2*b*. Pins b1*a*, b1*b*, b2*a* and b2*b* are located in, or at least below but adjacent to, the lower of the three wiring planes WL1 of FIG. 2. For parent-defined wiring in slot P2 between children C1 and C2, which includes connections to lower level buffer pins b1*a*, b1*b*, b2*a* and b2*b*, design logic 700 preferentially uses horizontal wiring tracks instead of vertical wiring tracks. That is, in selecting wiring locations or accessing pins b1*a*, b1*b*, b2*a* and b2*b*, design logic 700 selects multiple wiring tracks from horizontal layers WL1 and WL3 (FIG. 2) but only one vertical wiring track from layer WL2 (FIG. 2). Still more specifically, for interconnecting C1 and C2, which includes connections to the four pins b1*a*, b1*b*, b2*a* and b2*b* of buffers B1 and B2 in the illustrated instance, design logic 700 selects just one single vertical wiring track WTV1 but selects eight horizontal wiring tracks WTH1 through WTH8 in the region of slot P2 near buffers B1 and B2. It should be understood that using only the one single vertical wiring track comes at the expense of using eight horizontal wiring tracks in this instance.

Note that design logic 700 applies wiring contract rules for vertically oriented placement areas that are converse to the rules applied for horizontal placement areas. That is, in the design logic 700 imposed wiring contract for child C1 concerning parent slots P3 and P4, which are located within the physical boundaries of child C1, design logic 700 allocates to parent chip 110 a large number of vertical wiring tracks in slots P3 and P4 for wiring between child C1 and other children (not shown in FIG. 1) or between and C2 and other children, but only a small number of vertical tracks. Also, since child unit C1 inevitably needs to interconnect macros located on either side of each slot P3 and P4, child unit C1 needs many more horizontal than vertical wiring tracks in the physical areas of slots P3 and P4. Accordingly, design logic 700 allocates to child unit C1, more of the horizontal tracks in slots P3 and P4.

Referring to both FIGS. 2 and 3, pin b1*a* is located in, or at least below but adjacent to, the lower of the three wiring planes WL1, as previously mentioned. Wiring segment 302 is in horizontal wiring track WTH1, which is in wiring plane WL1, and is connected to wiring segment 304. Wiring segment 304 is in vertical wiring track WTV1, which is in wiring plane WL2, and is connected to wiring segment 306. Wiring segment 306 is in horizontal wiring track WTH2, which is in wiring plane WL3. Wiring segment 306 is accessible by a vertical wiring segment (not shown) above wiring plane WL3, so that a conductive connection may be established to pin b1*a* therefrom via die wiring segments 302, 304 and 306. Each of the other illustrated pins b1*b*, b2*a* and b2*b* are likewise connected to three respective wiring segments located in respective wiring tracks, so dial each pin b1*b*, b2*a* and b2*b* is accessible by a respective vertical wiring segment (not shown) above wiring plane WL3 for establishing conductive connections to the respective pins.

Buffer pins such as b1*a*, b1*b*, b2*a* and b2*b* of buffers B1 and B2 are typically in one of the lower wiring layers, as in the illustrated instance. It should be appreciated from the forgoing description of wiring to pins b1*a*, b1*b*, b2*a* and b2*b* of buffers B1 and B2, once again, that it is an objective of the illustrated embodiment of the present invention to reduce wiring the quantity of wiring tracks allocated to the parent 110 for wiring layers that run vertically in horizontal placement slot P2, the end result being child C2 gets more vertical tracks to make it's intra-child connections (M7 to M8 for example) for child units C1 and C2 in at least physically lower wiring layers that run vertically in horizontal wiring slot P2, since slot P2 is located in child unit C2 and is designated for wiring between child units C1 and C2.

Figure 4:
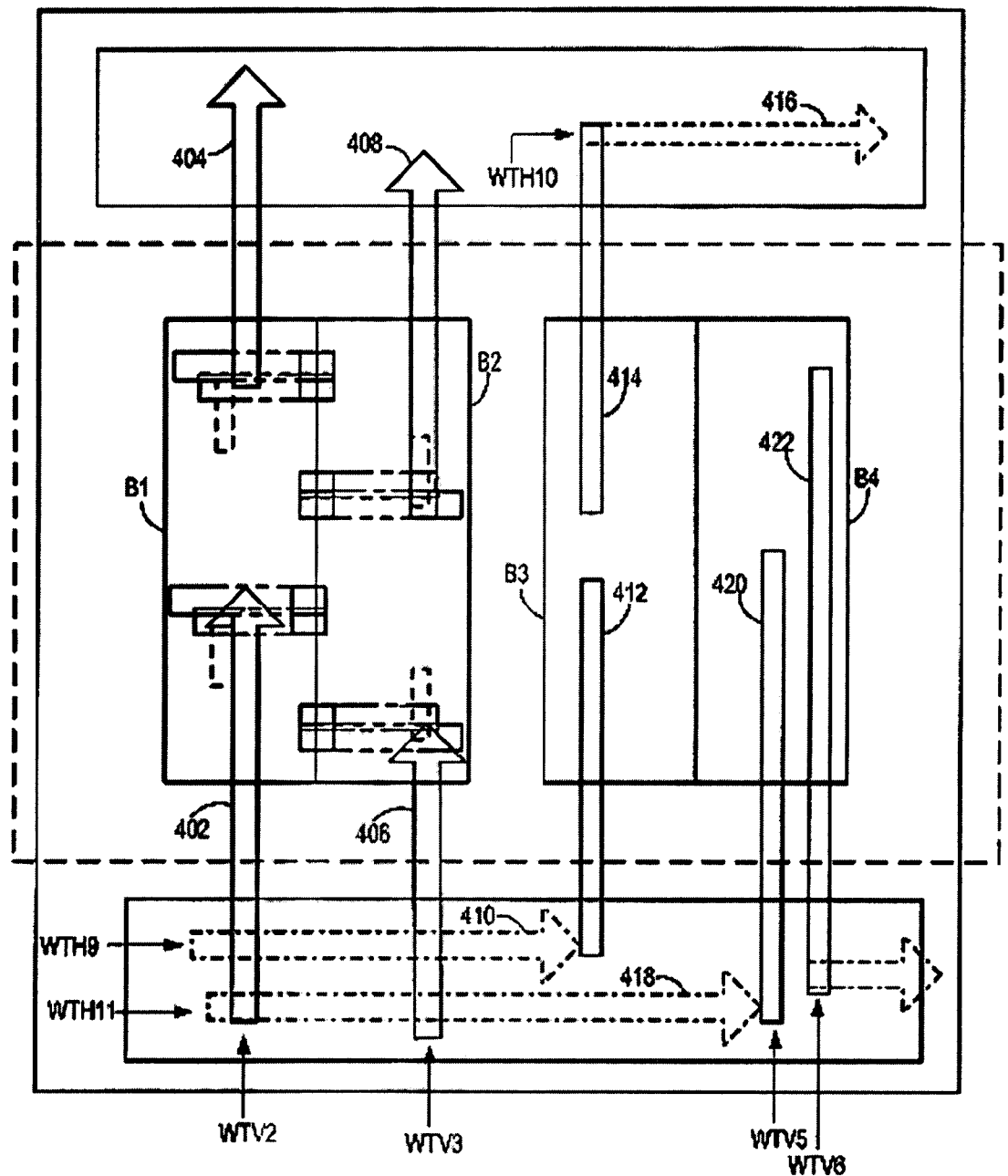
FIG. 4 illustrates wiring track inefficiencies that occur when buffers reside in placement slots oriented in the same direction as their data flow, according to an embodiment of the present invention.

FIG. 4 illustrates additional aspects of an embodiment of the present invention. In particular, FIG. 4 illustrates how it is also an advantage, in the context of the particular wiring structures and processes disclosed herein, to locate buffers in wiring slots that are oriented perpendicular to data flow, which tends to maximize wiring efficiency. All four illustrated buffers B1-B4 illustrated in the given instance have data flow from bottom to top, as shown in FIG. 4. However, for buffers B1 and B2 the overall data flow is vertical in orientation and the buffers B1 and B2 are located in a horizontally oriented wiring slot P2, which is preferred. On the other hand, for buffers B3 and B4 the overall data flow is horizontal in orientation, but the buffers B1 and B2 are also located in a horizontally oriented wiring slot P2, which is the not preferred.

That is, in the illustrated instance, buffers B1 and B2 are interposed in wiring that is much longer in the vertical direction than in the horizontal direction, as figuratively depicted in FIG. 4 by input wire 402 and output wire 404 for buffer B1 and by input wire 406 and output wire 408 for buffer B2. In other words, a large proportion of the length of input wires and output wires connected to buffer B1, as depicted in FIG. 4 by wire segments 402 and 404, is vertical in orientation (and, conversely, a small proportion of the length is horizontal). This is referred to herein as a vertical orientation of data flow for buffer B1. Likewise, a large proportion of the extent of input wires and output wires for buffer B2, as depicted in FIG. 4 by wire segments 406 and 408, is vertical in orientation (and, conversely, a small proportion of the length is horizontal). This illustrates the above mentioned advantageous layout that design logic 700 preferentially selects, according to which buffers B1 and B2 are located in horizontal wiring slots and the major extent of input and output wiring segments connected to buffers B1 and B2 are vertically aligned with one another, so that the wiring segments are mainly in only one wiring track, i.e., in wiring track WTV2 for B1, and in wiring track WTV3 for B2.

On the other hand, in the illustrated instance, buffers B3 and B4 are interposed in wiring that is much longer in the horizontal direction than in the vertical direction, as figuratively depicted in FIG. 4 by input wires 410 and 412 and output wires 414 and 416 for buffer B3 and by input wires 418 and 420 and output wires 422 and 424 for buffer B4. In other words, a large proportion of the length of input wires and output wires connected to buffer B3, as depicted in FIG. 4 by wire segments 410, 412, 414, and 416 is horizontal in orientation (and, conversely, a small proportion of the length is vertical). This is referred to herein as a horizontal orientation of data flow for buffer B3. Likewise, a large proportion of the length of input wires and output wires connected to buffer B4, as depicted in FIG. 4 by wire segments 418, 420, 422, and 424 is horizontal in orientation (and, conversely, a small proportion of the length is vertical). This illustrates the opposite of the above mentioned preferentially selected configuration, because buffers B3 and B4 are located in horizontal wiring slots but large proportions of input and output wiring segments connected to buffers B3 and B4 ate horizontally oriented. Buffer B3 illustrates a result of this disadvantageous configuration, wherein two horizontal tracks WTH9 and WTH10 and a vertical track WTV4 must be used, likewise, buffer B4 illustrates a result of this disadvantageous configuration, wherein two vertical tracks WTV5 and WTV6 and a horizontal track WTH11 must be used.

Figure 5A:
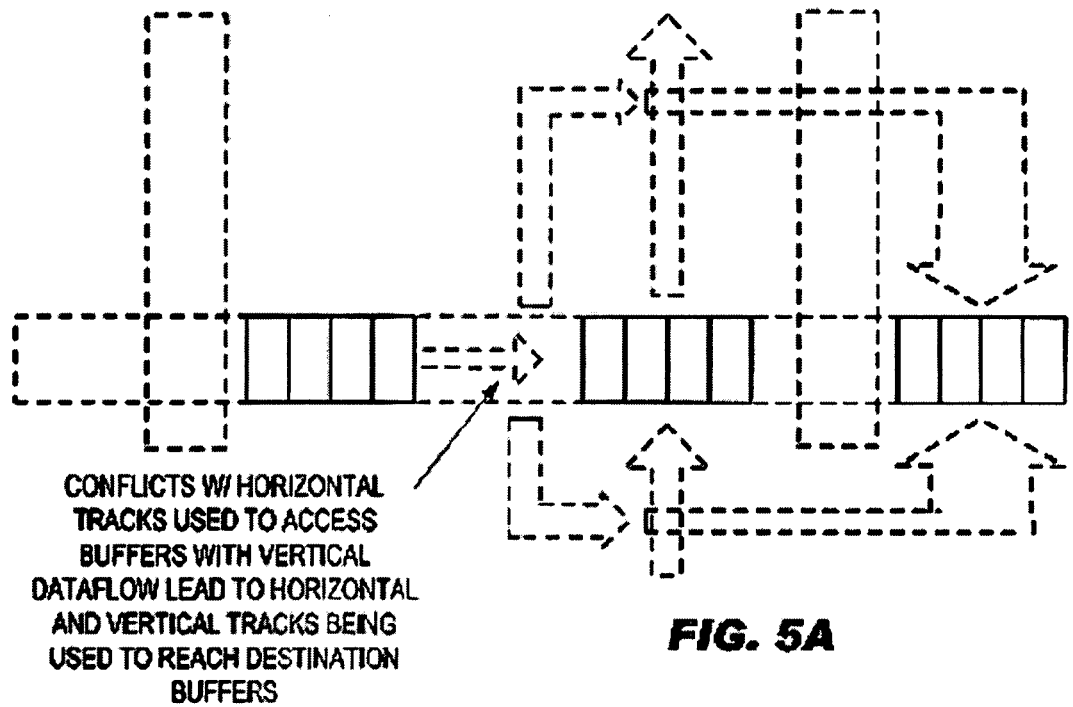
FIG. 5 shows improvement in wiring track utilization when buffers are moved from placement slots running parallel to buffer data flow to slots running perpendicular to buffer data flow, according to an embodiment of the present invention.
Figure 5B:
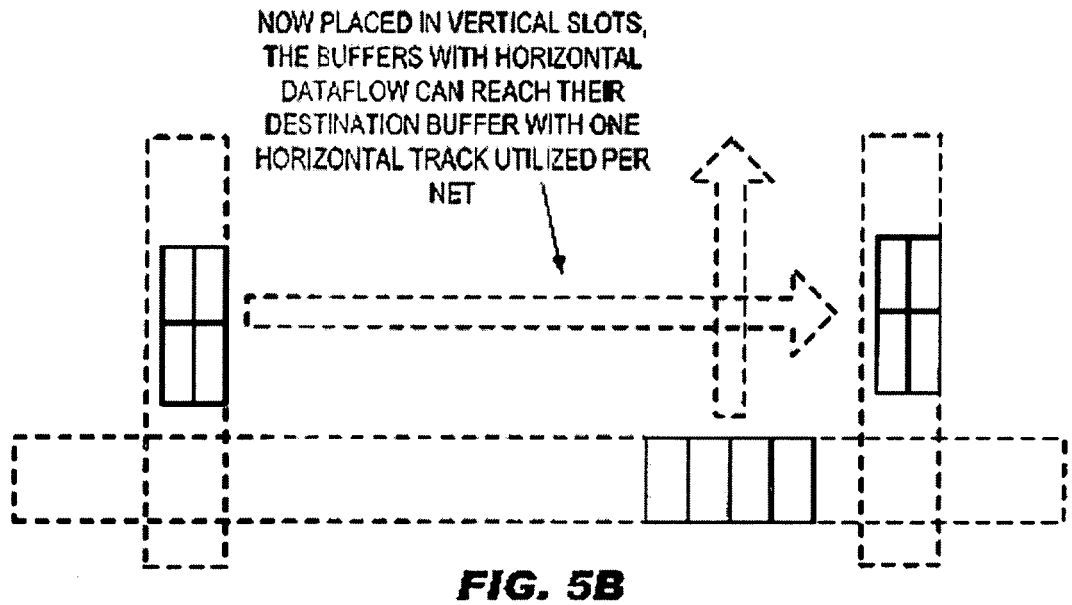

FIGS. 5A and 5B illustrate in a general fashion the above described and illustrated advantage associated with locating buffer in wiring slots oriented perpendicular to data flow (or, conversely, the disadvantage of slot orientation that is parallel to data flow orientation), in the context of the particular wiring structures and processes disclosed herein. FIG. 5A shows that wiring conflicts arise between horizontal tracks used by buffers in a horizontal slot with horizontal data flow and horizontal tracks used to access buffers with vertical data flow in that same slot This leads to multiple wiring tracks being used for a single connection. FIG. 5B shows that less wiring tracks are used in interconnecting buffers with horizontal data flow, where the buffers are located in vertical slots, according to a preferred configuration in an embodiment of the invention.

Figure 6:
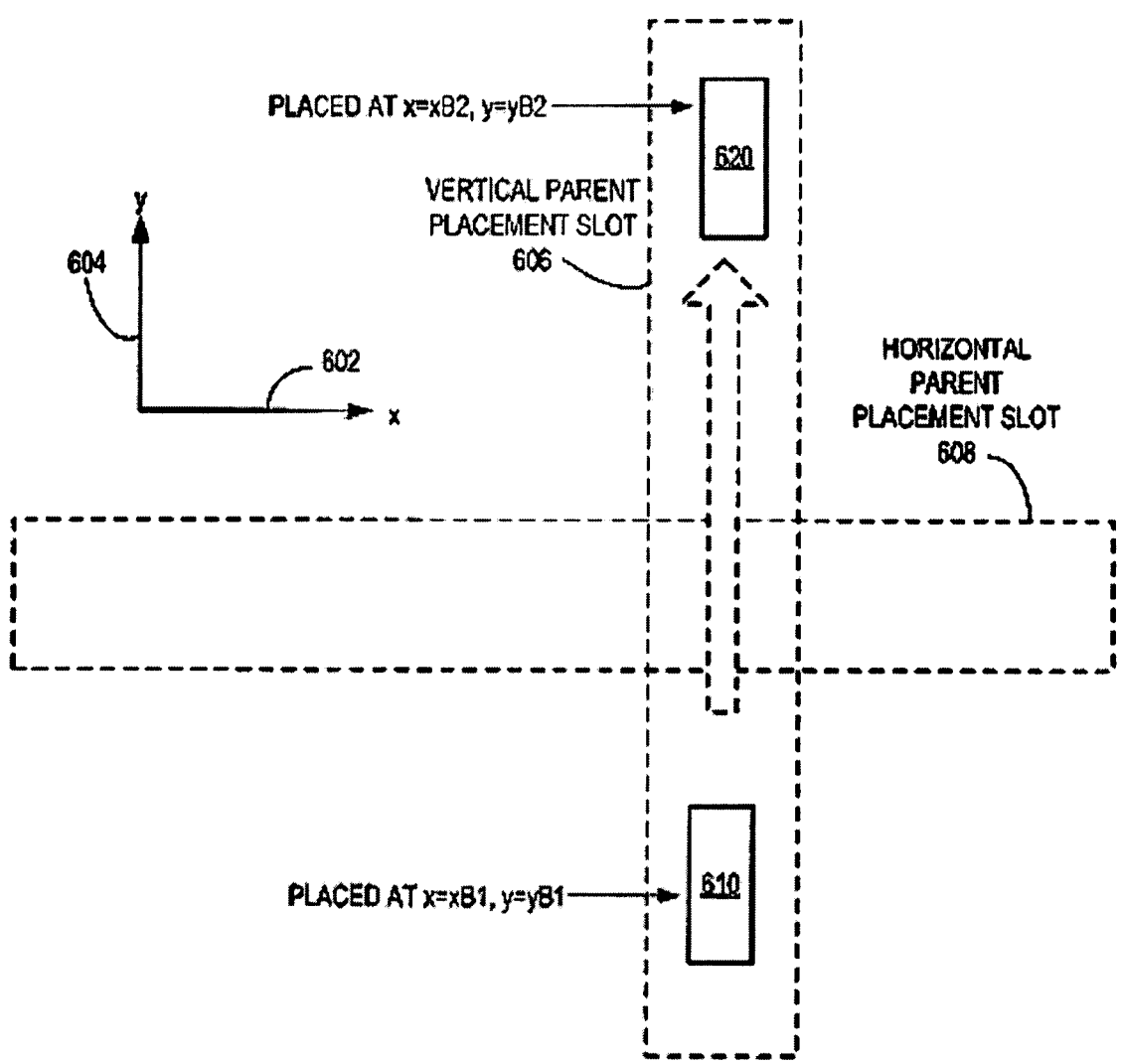
FIG. 6 illustrates specific buffer locations with respect to horizontal and vertical placement slots.

FIG. 6 illustrates a way of identifying strongly oriented vertical data flow, according to an embodiment of the present invention. Buffers 610 and 620 are shown located within vertical slot 606 but not within horizontal slot 608. Buffers 610 and 620 are also shown relative to an x axis 602 that provides a coordinate for horizontal displacement from some initial point and a y axis 604 that provides a coordinate for vertical displacement from that point As shown, buffers 610 and 620 are aligned vertically, so that their x coordinates (i.e., horizontal coordinates) are equal. Consequently, delta x=0. Their y coordinates (i.e., vertical coordinates) are not equal. Consequently, their delta y is not 0, so their delta x/delta y=0. Since wiring is laid out in orthogonal fashion on the chip, delta x indicates a horizontal wiring length for the wiring between buffers 610 and 620 and delta y indicates vertical wiring length for the wiring between buffers 610 and 620. In the illustrated instance, the ratio of the relative horizontal wiring length to vertical wiring length for buffers 610 and 620 is less than some predetermined threshold value. This illustrates a definition of strong vertically oriented data flow between buffers 610 and 620, wherein:

vertically oriented data flow $IF$(delta $x$/delta $y$)<predetermined value $V$flow.

A definition of strong horizontally oriented data flow between buffers 610 and 620 is, conversely:

horizontally oriented data flow $IF$(delta $y$/delta $x$)<predetermined value $V$flow.

Figure 7:
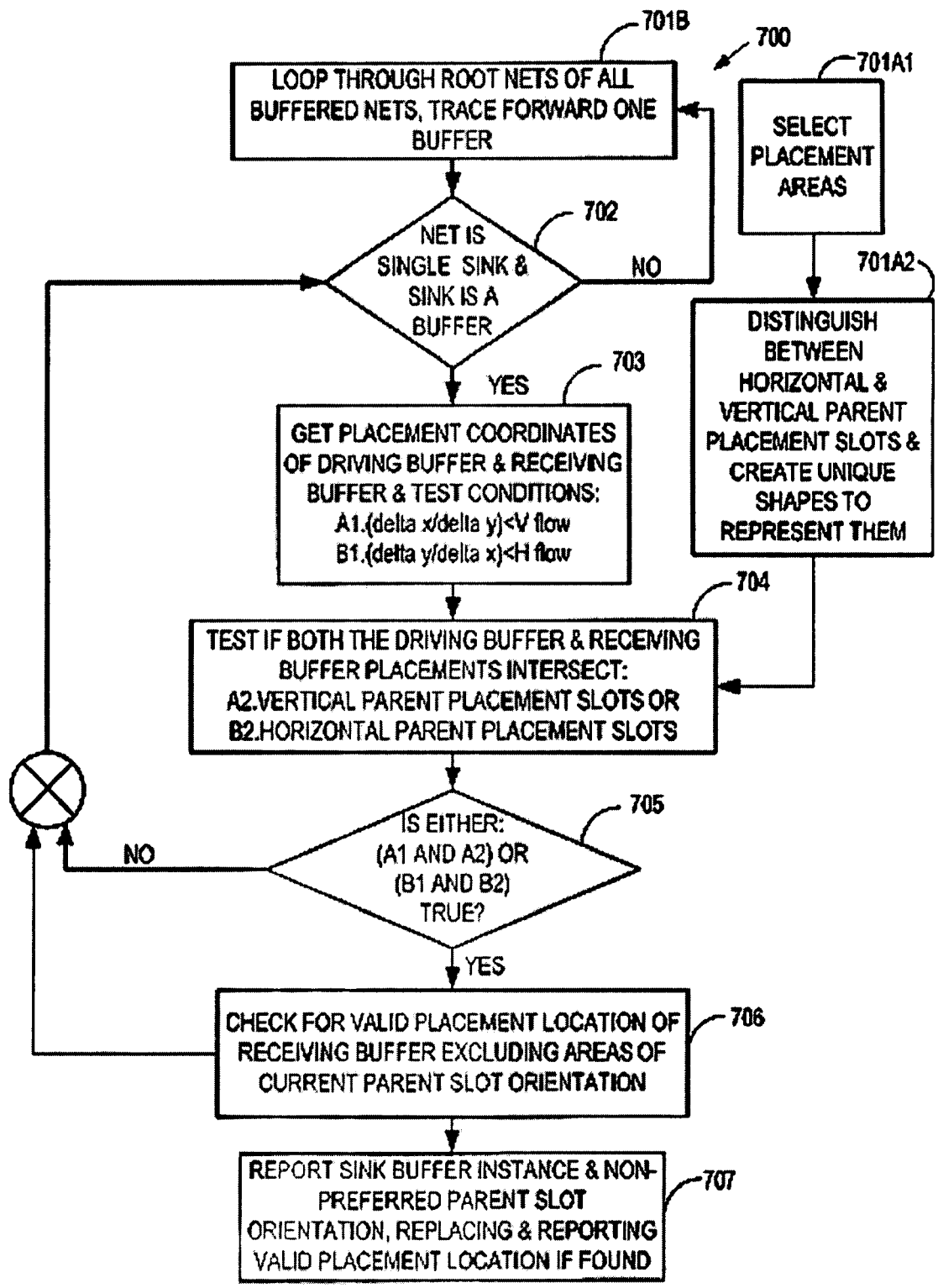
FIG. 7 is a flow diagram of process steps, according to an embodiment of the present invention.

Referring now to FIG. 7, aspects of logic design process 700 for wiring and buffer placement on a VLSI chip are illustrated, according to an embodiment of the present invention. The method implemented by process 700 relates to a design stage in which parent level nets have been buffered and all child entities (including buffers) have been placed. (As mentioned previously, wiring may be referred to as "nets" and includes buffered wiring such as illustrated and described herein above.) In a step 701A1 logic design process selects portions of the chip for use as placement areas for respective parent and children entities. In a step 701A2, logic design process 700 reviews parent placement areas and selects at least portions of them for designation as respective horizontal and vertical wiring slots based on their geometries, which includes storing coordinates for boundaries of the slots according to slot placement. In particular, this categorization is based on the aspect ratio detecting a shape of die parent placement area, where the aspect ratio of the length and width of the shape exceeds predetermined limits, e.g., aspect ratio <1;10 or aspect ratio >10. Parent placement areas P1 and P2 (FIG. 1) illustrate areas that are in this manner designated as horizontal slots, while parent placement areas P3 and P4 illustrate areas that are thus designated as vertical slots.

Two unique sets of shapes are generated to represent the horizontal and vertical slots. Typically, these shapes are based on existing shapes used in the silicon and wiring contract generation process between parent and child entities. That is, shapes are defined and used in the design process to help establish the placement and wiring contracts between parent and child entities. For example, slots P2, P3 and P4 of FIG. 1 were initially defined by rectangular shapes which were then used to "cut" those placement areas from children entities C1 and C2, thereby blocking the area to C1 and C2 for placement at their level and allowing the chip to place there. Likewise, these shapes also corresponded to particular wiring levels and tracks being contracted between child and parent.

In an initialization step at 701C, logic design process 700 tabulates the root nets of all buffered nets in the design to be reviewed. That is, in the design process, nets are analyzed to determine if buffers are needed. A "root net" in this context refers to an original net that was buffered, i.e., to which one or more buffers was added. For example, in the case where a net ABC receives 2 buffers in the buffering process, with new net names ABCn1 and ABCn2, net ABC is considered to be the "root" net of this buffer chain, that is, ABC would be the root net of both ABCn1 and ABCn2. Then, in a first iteration of step 701B, logic design process 700 selects a first root net, traces the net path forward one buffer and checks to determine if the net has only one sink and, if so, whether that sink is a buffer.

If this criterion is not met, then process 700 skips to a next root net and returns to step 701B, and so on, so that by iterating repeatedly through step 701B, process 700 checks all buffered nets. If this criterion is met, processing proceeds to step 103 where process 700 gets current placement coordinates of the driving and receiving buffers selected for the current iteration and computes the test conditions described above regarding FIG. 6, thereby determining whether the buffers exhibit either condition A1, vertical oriented data flow, or condition B1, horizontal data flow.

Next, at 704, process 700 compares the current placement coordinates of the buffers to coordinates for boundaries of the vertical and horizontal wiring slots determined at 700, and thereby determines whether current placements of both the buffers fall within boundaries of any of these slots. More specifically, process 700 determines whether placement of both buffers satisfies either condition A2, wherein both buffers fall within boundaries of vertical placement slots, or condition B2, wherein both buffers fall within boundaries of horizontal placement slots. In other words, the placements of both the driving and receiving buffers are tested to see if they intersect either of the two unique sets of shapes generated in step 100 to represent horizontal and vertical parent placements areas. Referring to FIG. 6, Buffer 1 and Buffer 2 both intersect the set of shapes generated to represent the vertical parent placement areas, thereby satisfying condition A2 of step 104.

Then, at 705, process 700 determines whether either conditions A1 and A2 exist or conditions B1 and B2 exist. Processing proceeds to step 105, where the results of steps 103 and 104 are reviewed to determine if either conditions A1 and A2 were met or conditions B1 and B2 were met. The combination of conditions A1 and A2 represent a buffer to buffer connection with strongly oriented vertical data flow where both buffers are placed in vertical parent placement slots. Likewise, the combination of conditions B1 and B2 represent a buffer to buffer connection with strongly oriented horizontal data flow where both buffers are placed in horizontal parent placement slots. The buffer to buffer connection depicted in FIG. 5 meets conditions A1 and A2.

If neither of the conditions (A1 and A2) or (B1 and B2) are met, process 700 returns to 702 and the path is traced forward one buffer.

If one of the conditions is met, this indicates process 700 has detected a non-preferred configuration in which, for the current pair of buffers in their current locations, data flow between the buffers is oriented in the same orientation as that of the wiring slots in which the buffers are currently placed, hi this case, process 700 checks at 706 for an alternative placement location for the receiving buffer, excluding areas having current parent placement slot's orientation. Process 700 refers to stored wire specifications of both the input and output nets of the sink buffer to establish acceptable net length limits in order to further limit the set of placement areas to consider for the alternative placement locations.

That is, the unique set of shapes generated in step 700 corresponding to the current parent placement slot orientation are now used to represent placement blockage and an attempt is made to find a new placement location in a valid placement location, i.e., in a slot having the opposite orientation or in a parent placement area that does not have the form of a slot, that satisfies die net length limit for input and output net.

If such a valid placement location is found, process 700 stores a record of the new placement location along with the net name of the connection, die sink buffer instance name, current placement location of the sink buffer, and orientation of the non-preferred parent placement slot. If no new valid placement location is found, the same information is recorded with the exception of the new valid placement location.

Next, upon completion of this iteration of 706, process 700 skips to a next root net and returns to step 701B, and so on, so that by iterating repeatedly through step 701B all buffered nets are checked.

Upon completion of all iterations of method 700, such that all buffer root nets are examined, at 707 process 700 places buffers for which new placement locations were found at those new locations and outputs the information recorded, as described above, to file for designer review. Alternatively, process 700 presents the report of all the stored instances to a user, so that the user can immediately take further action based on this useful information revealing non-ideal physical arrangements on the chip.

The ideal result is described in FIGS. 5A and 5B where the buffers with horizontal data flow originally residing in a horizontal placement slot are replaced in vertical placement slots. Instead of each connection requiring multiple wiring tracks to reach the destination buffer in the original scenario, the resulting placement location allows for one horizontal wiring track to be used per connection. Wiring track utilization is maximized, freeing up trades for other nets and reducing wiring congestion. This has the dual benefit of helping to reduce turn around time for routing closure as well as minimizing the potential for wired routes taking 'scenic" paths (routes longer than Steiner) and impacting timing targets.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Computer Program Product

The present invention, aspects of which are shown in the above FIG's., may be distributed in the form of instructions, which may include data structures and may be referred to as a "computer program," "program," "program code," "software," "computer software," "resident software," "firmware," "microcode," etc Stored on a computer-readable storage medium, such instructions and storage medium may be referred to as a "computer program product," "program product," etc.

The computer program product may be accessible from a computer-readable storage medium providing program code for use by or in connection with a computer or any instruction execution system. The present invention applies equally regardless of the particular type of media actually used to carry out the distribution. The instructions are read from the computer-readable storage medium by an electronic, magnetic, optical, electromagnetic or infrared signal. Examples of a computer-readable storage medium include a semiconductor or solid state memory, magnetic tape, a removable computer diskette, a random access memory (RANT), a read-only memory (ROM), a rigid magnetic disk and an optical disk. Current examples of optical disks include compact disk-read only memory (CD-ROM), compact disk-read/write (CD-R/W) and DVD. The instructions may also be distributed by digital and analog communications links, referred to as "transmission media."

Computer System

A data processing system suitable for storing and/or executing program code includes at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 8:
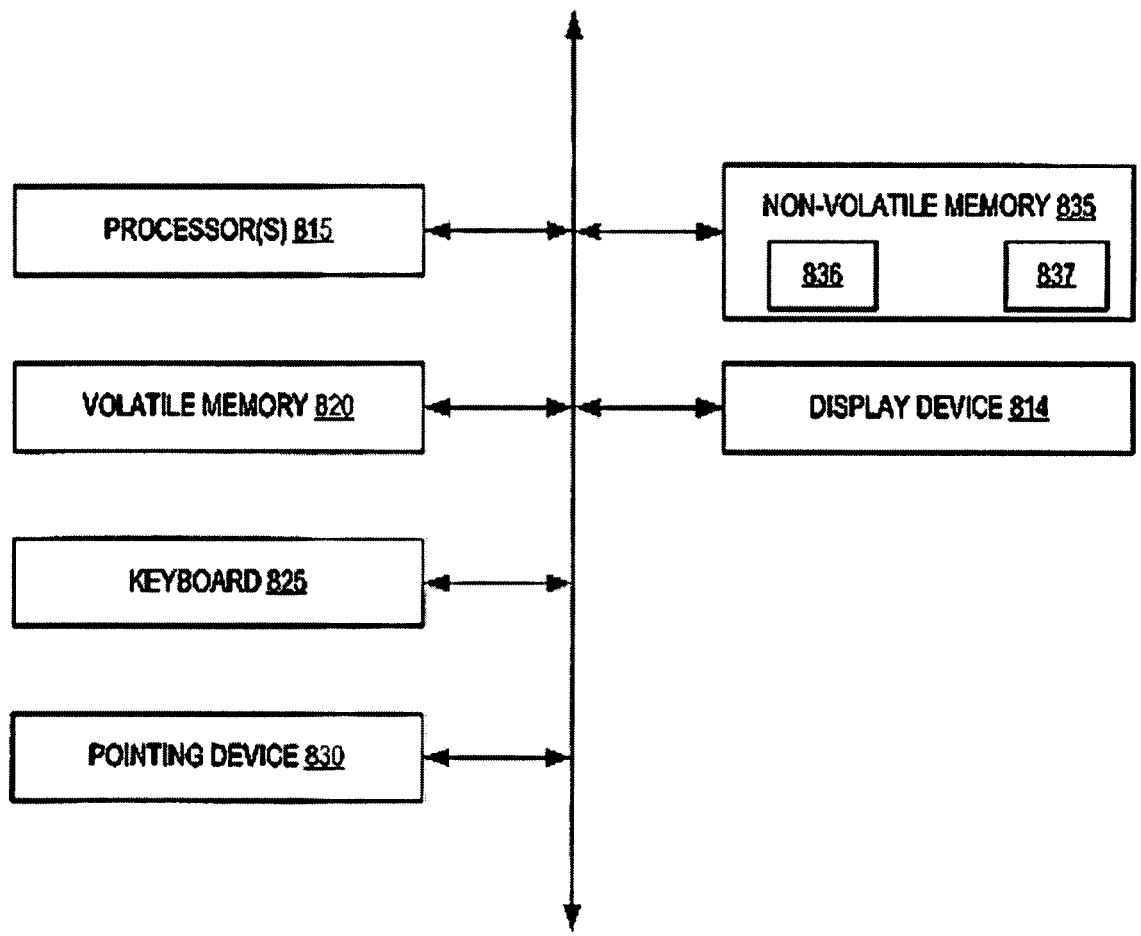
FIG. 8 illustrates a computer system having instructions to implement a method in accordance with and embodiment of the present invention.

Referring now to FIG. 8, a computer system 810 is illustrated, which may take a variety of forms, including a personal computer system, mainframe computer system, workstation, server, etc. That is, it should be understood that the term "computer system" is intended to encompass any device having a processor that executes instructions from a memory medium. In the illustrated system embodiment, system 810 includes one or more processors 815, a keyboard 825, a pointing device 830, and tangible, computer-readable storage media, including volatile 820, and nonvolatile memory 835, e.g., ROM, hard disk, floppy disk, CD-ROM, and DVD, and display device 814.

Memory 835 of system 810 stores computer programs 836 (also known as "software programs"), wherein programs 836 include instructions that are executable by one or more processors 815 to implement various embodiments of a method in accordance with the present invention. Memory 83S of system 810 also has data 837 stored thereon that provides circuit structures, logical entity properties including physical locations, etc. Programs 836 include instructions for implementing the process 700 of FIG. 7, for example, as well as other processes describe herein.

Those of ordinary skill in the art will appreciate that the hardware in FIG. 8 may vary depending on the implementation. For example, other peripheral devices may be used in addition to or in place of die hardware depicted in FIG. 8. The depicted example is not meant to imply architectural limitations with respect to the present invention. Various embodiments of system 810 implement one or more software programs 836 and data 837 in various ways, including procedure-based techniques, component-based techniques, and/or object-oriented techniques, among others. Specific examples include XML, C, C++ objects, lava and commercial class libraries.

General Remarks

The terms "circuitry" and "memory," and the like are used herein. It should be understood that these terms refer to circuitry that is part of the design for an integrated circuit chip such as device 110 FIG. 1. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by die fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

An embodiment of the invention has been described in which, among other things, a first wiring buffer of a IC device is detected that is associated with a parent entity and has an initial location in a first one of parent placement areas within a child physical area and in which placement of the first wiring buffer is changed responsive to detecting correspondence between geometric orientation of the first one of the parent placement areas and data flow orientation of the first wiring buffer. It should be understood mat the device may have additional levels of hierarchy, e.g., grandchild, great-grandchild, etc, and that the invention also applies to detecting a wiring buffer that is associated with a child entity and has an initial location in a first one of child placement areas within a grandchild physical area and in which placement of the wiring buffer is changed responsive to detecting correspondence between geometric orientation of the first one of the child placement areas acid data flow orientation of the wiring buffer, etc. likewise, the invention may apply to detecting a grandchild entity, etc.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

Unless clearly and explicitly stated, the claims that follow are not intended to imply any particular sequence of actions. The inclusion of labels, such as a), b), c) etc., for portions of the claims does not, by itself, imply any particular sequence, but rather is merely to facilitate reference to the portions.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method in the design of an integrated circuit device, wherein the device includes child logical entities having physical areas located within a physical area of a parent logical entity and having parent placement areas for placement of buffers associated with the parent for wiring among ones of the child entities, the method comprising:
    a) placing wiring buffers in initial locations in ones of the placement areas;
    b) detecting a first wiring buffer associated with the parent entity and having an initial location in a first one of the parent placement areas within the child physical area;
    c) detecting geometric orientations of the parent placement areas, wherein detecting the geometric orientations comprises detecting lack of geometric orientations of ones of the placement areas;
    d) detecting a data flow orientation for the first wiring buffer; and
    e) changing, using a computer system, the location of the first wiring buffer responsive to detecting correspondence between the geometric orientation of the first one of the parent placement areas and the data flow orientation of the first wiring buffer, wherein changing the location of the first wiring buffer comprises selecting a second placement area for the changed location from among ones of the placement areas having no detected geometric orientation or having geometric orientations not corresponding to the data flow orientation of the first wiring buffer.

2. The method of claim 1, wherein c) comprises:
    computing aspect ratios of placement areas responsive to respective lengths and widths of the placement areas; and
    comparing the computed aspect ratios to predetermined thresholds.

3. The method of claim 1, wherein b) comprises:
    identifying that the first wiring buffer is a sink and is connected in a net to a source wiring buffer, wherein the net has no other sink wiring buffer.

4. The method of claim 1, wherein d) comprises:
    comparing vertical wire length and horizontal wire length of the net between the source and sink wiring buffers.

5. The method of claim 1, wherein e) comprises:
    selecting a second parent placement area for the changed location from among ones of the parent placement areas having geometric orientations not corresponding to the data flow orientation of the first wiring buffer.

6. The method of claim 1, comprising the step of:
    selecting the placement areas.

7. A computer program product, stored on a computer readable storage medium, for design of an integrated circuit device, wherein the device includes child logical entities having physical areas located within a physical area of a parent logical entity and having parent placement areas for placement of buffers associated with the parent for wiring among ones of the child entities, the computer program product having instructions for execution by a computer, wherein the instructions, when executed by the computer, cause the computer to implement a method comprising the steps of:
    a) placing wiring buffers in initial locations in ones of the placement areas;
    b) detecting a first wiring buffer associated with the parent entity and having an initial location in a first one of the parent placement areas within the child physical area;
    c) detecting geometric orientations of the parent placement areas, wherein detecting the geometric orientations comprises detecting lack of geometric orientations of ones of the placement areas;
    d) detecting a data flow orientation for the first wiring buffer; and
    e) changing the location of the first wiring buffer responsive to detecting correspondence between the geometric orientation of the first one of the parent placement areas and the data flow orientation of the first wiring buffer, wherein changing the location of the first wiring buffer comprises selecting a second placement area for the changed location from among ones of the placement areas having no detected geometric orientation or having geometric orientations not corresponding to the data flow orientation of the first wiring buffer.

8. The computer program product of 7, wherein c) comprises:
    computing aspect ratios of placement areas responsive to respective lengths and widths of the placement areas; and
    comparing the computed aspect ratios to predetermined thresholds.

9. The computer program product of 7, wherein d) comprises:
    comparing vertical wire length and horizontal wire length of the net between the source and sink wiring buffers.

10. The computer program product of 7, wherein e) comprises:
    selecting a second parent placement area for the changed location from among ones of the parent placement areas having geometric orientations not corresponding to the data flow orientation of the first wiring buffer.

11. A computer system comprising:
    a processor; and
    a storage device connected to the processor, wherein the storage device has stored thereon a program for controlling the processor for design of an integrated circuit device, wherein the device includes child logical entities having physical areas located within a physical area of a parent logical entity and having parent placement areas for placement of buffers associated with the parent for wiring among ones of the child entities, and wherein the processor is operative to execute instructions of the program to implement a method comprising the steps of:
    a) placing wiring buffers in initial locations in ones of the placement areas;
    b) identifying one of the wiring buffers having an initial location in a first one of the placement areas;
    c) detecting geometric orientations of ones of the placement areas, wherein detecting the geometric orientations comprises detecting lack of geometric orientations of ones of the placement areas;

d) detecting a data flow orientation for the one of the wiring buffers; and e) responsive to detecting correspondence between the geometric orientation of the first one of the placement areas and the data flow orientation of the one of the wiring buffers, wherein changing the location of the one of the wiring buffers comprises selecting a second placement area for the changed location from among ones of the placement areas having no detected geometric orientation or having geometric orientations not corresponding to the data flow orientation of the one of the wiring buffers.

12. The system of claim 11, wherein c) comprises:

computing aspect ratios of placement areas responsive to respective lengths and widths of the placement areas; and comparing the computed aspect ratios to predetermined thresholds.

13. The system of claim 11, wherein b) comprises:

identifying that the one of the wiring buffers is a sink and is connected in a net to a source wiring buffer, wherein the net has no other sink wiring buffer.

14. The system of claim 11, wherein d) comprises:

comparing vertical wire length and horizontal wire length of the net between the source and sink wiring buffers.

15. The system of claim 11, wherein e) comprises:

selecting a second placement area for the changed location from among ones of the placement areas having geometric orientations not corresponding to the data flow orientation of the one of the wiring buffers.

16. The system of claim 11, wherein the entities include a parent entity having a parent physical area and child entities having child physical areas within the parent physical area, and wherein the one of the wiring buffers is a buffer for wiring from one of the child entities to another one of the child entities.

17. The system of claim 11, wherein the placement areas include parent placement areas located at least partly within ones of the child entities, and wherein a) includes placing the one of the wiring buffers in a portion of a placement area in one of the child entities.

* * * * *